United States Patent
Lee et al.

(10) Patent No.: US 9,467,121 B2
(45) Date of Patent: Oct. 11, 2016

(54) APPARATUS AND METHOD FOR COMPENSATING FOR PROCESS VARIATION IN ELECTRONIC DEVICE

(71) Applicant: Samsung Electronics Co., Ltd., Suwon-si. Gyeonggi-do (KR)

(72) Inventors: Joon-Hee Lee, Goyang-si (KR); Jong-Won Choi, Seongnam-si (KR); Sang-Wook Han, Suwon-si (KR); Sung-Jun Lee, Suwon-si (KR); Young-Taek Lee, Seongnam-si (KR); Young-Gun Pu, Jeju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 88 days.

(21) Appl. No.: 14/468,939

(22) Filed: Aug. 26, 2014

(65) Prior Publication Data

US 2015/0130514 A1 May 14, 2015

(30) Foreign Application Priority Data

Nov. 12, 2013 (KR) .................. 10-2013-0137017

(51) Int. Cl.

| H03B 1/00 | (2006.01) |
|---|---|
| H03K 3/012 | (2006.01) |
| H03K 17/687 | (2006.01) |
| H03K 17/14 | (2006.01) |
| H03B 5/12 | (2006.01) |
| H03B 5/04 | (2006.01) |

(52) U.S. Cl.
CPC ............... *H03K 3/012* (2013.01); *H03B 5/04* (2013.01); *H03B 5/124* (2013.01); *H03B 5/1212* (2013.01); *H03B 5/1228* (2013.01); *H03B 5/1234* (2013.01); *H03K 17/145* (2013.01); *H03K 17/6877* (2013.01)

(58) Field of Classification Search
None
See application file for complete search history.

(56) References Cited

U.S. PATENT DOCUMENTS

| 8,390,349 B1 | 3/2013 | Ravi et al. |
|---|---|---|
| 9,112,484 B1 * | 8/2015 | Clark ................... H03K 3/0315 |
| 2006/0158271 A1 | 7/2006 | Juang et al. |
| 2007/0205816 A1 | 9/2007 | Kim |
| 2008/0018369 A1 | 1/2008 | Chatterjee et al. |
| 2009/0085679 A1 | 4/2009 | Jennings et al. |
| 2009/0289725 A1 | 11/2009 | Fu |
| 2013/0195165 A1 * | 8/2013 | Poulton ..................... H04B 1/04 375/229 |
| 2013/0234755 A1 * | 9/2013 | Chang ................ H03K 19/0005 326/30 |
| 2014/0028409 A1 * | 1/2014 | Mahooti ................... G05F 3/30 331/146 |
| 2014/0111257 A1 * | 4/2014 | Ying ...................... H03K 3/013 327/117 |
| 2015/0070074 A1 * | 3/2015 | Dedic ................... H03K 17/145 327/382 |
| 2015/0070202 A1 * | 3/2015 | Dedic .................. H03K 17/063 341/144 |
| 2015/0130522 A1 * | 5/2015 | Li ........................ H03L 7/0992 327/158 |
| 2015/0280723 A1 * | 10/2015 | Fan ......................... H03L 7/085 327/156 |

FOREIGN PATENT DOCUMENTS

KR          10-0717103 B1      5/2007

* cited by examiner

*Primary Examiner* — Lincoln Donovan
*Assistant Examiner* — Khareem E Almo
(74) *Attorney, Agent, or Firm* — Jefferson IP Law, LLP

(57) ABSTRACT

An electronic device for compensating for process variation is provided. The electronic device includes a first circuit configured to consume a current supplied to the first circuit, and a second circuit configured to control the current supplied to the first circuit, The second circuit is configured to generate a signal for controlling the current supplied to the circuit based on a frequency of a pulse signal generated using a second component that is of a same kind as a first component of the first circuit.

20 Claims, 11 Drawing Sheets

APPARATUS AND METHOD FOR COMPENSATING FOR PROCESS VARIATION IN ELECTRONIC DEVICE

CROSS-REFERENCE TO RELATED APPLICATION(S)

This application claims the benefit under 35 U.S.C. §119(a) of a Korean patent application filed on Nov. 12, 2013 in the Korean Intellectual Property Office and assigned Ser. No. 10-2013-0137017, the entire disclosure of which is hereby incorporated by reference.

TECHNICAL FIELD

The present disclosure relates to characteristic difference compensation of a circuit component according to process variation in an electronic device.

BACKGROUND

An electronic device includes many circuits. Particularly, a communication electronic device may include a circuit for controlling Radio Frequency (RF), and the circuit mostly includes a frequency synthesizer for generating a signal. In the frequency synthesizer, a block for generating a signal of an intended frequency is referred to as a Voltage Controlled Oscillator (VCO), and the VCO is one of circuits which consume a relatively considerable amount of current.

When a semiconductor circuit is fabricated, process variation may occur due to a location on a wafer. In a Complementary Metal Oxide Semiconductor (CMOS) process, a transistor is relatively subject to the great process variation. For example, based on the process variation, the transistor operates slowly in a Slow-Slow (SS) corner, fast in a Fast-Fast (FF) corner, and normally in a Typical-Typical (TT) corner. The circuit such as VCO, which is designed to stably operate even in the process variation, is typically designed based on the poorest process conditions, that is, based on the process characteristic where the transistor operates most slowly. As a result, the devices of relatively different operation speeds consume more current than necessary.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an apparatus and a method for compensating for process variation in an electronic device.

Another aspect of the present disclosure is to provide an apparatus and a method for preventing overcurrent supplied due to process variation in an electronic device.

Yet another aspect of the present disclosure is to provide an apparatus and a method for monitoring device characteristics according to process variation in an electronic device.

A further aspect of the present disclosure is to provide an apparatus and a method for optimizing power consumption by increasing and decreasing current according to process variation in an electronic device.

A further aspect of the present disclosure is to provide an apparatus and a method for minimizing current deviation by increasing and decreasing current at a constant level of an output signal of a circuit which varies according to process variation in an electronic device.

A further aspect of the present disclosure is to provide an apparatus and a method for minimizing current consumption in order to monitor and compensate for process variation in an electronic device.

In accordance with an aspect of the present disclosure, an electronic device is provided. The electronic device includes a first circuit configured to consume a current supplied to the first circuit, and, a second circuit configured to control the current supplied to the first circuit. Herein, the second circuit is configured to generate a signal for controlling the current based on a frequency of a pulse signal generated using a second component that is of a same kind as a first component of the first circuit.

In accordance with another aspect of the present disclosure, a method for operating an electronic device is provided. The method includes generating a pulse signal using a second component that is of a same kind as a first component of a circuit which consumes a current supplied to the circuit, and generating a signal for controlling the current supplied to the circuit based on a frequency of the pulse signal.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein may be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Various embodiments of the present disclosure provide a technique for compensating for process variation in an electronic device.

Hereinafter, the process variation indicates variation occurring in performance of a component according to physical/environmental factors in semiconductor fabrication. For example, the process variation may include a Slow-Slow (SS) corner of a slow operation speed, a Fast-Fast (FF) corner of a fast operation speed, and a Typical-Typical (TT) corner of a typical operation speed, and may further include other cases than those three corners. To ease the understanding, three process characteristics, including a first process characteristic, a second process characteristic, and a third process characteristic, are illustrated. Hereafter, the first process characteristic corresponds to the fast operation speed and the FF corner, the second process characteristic corresponds to the typical operation speed and the TT corner, and the third process characteristic corresponds to the slow operation speed and the SS corner.

Figure 1:
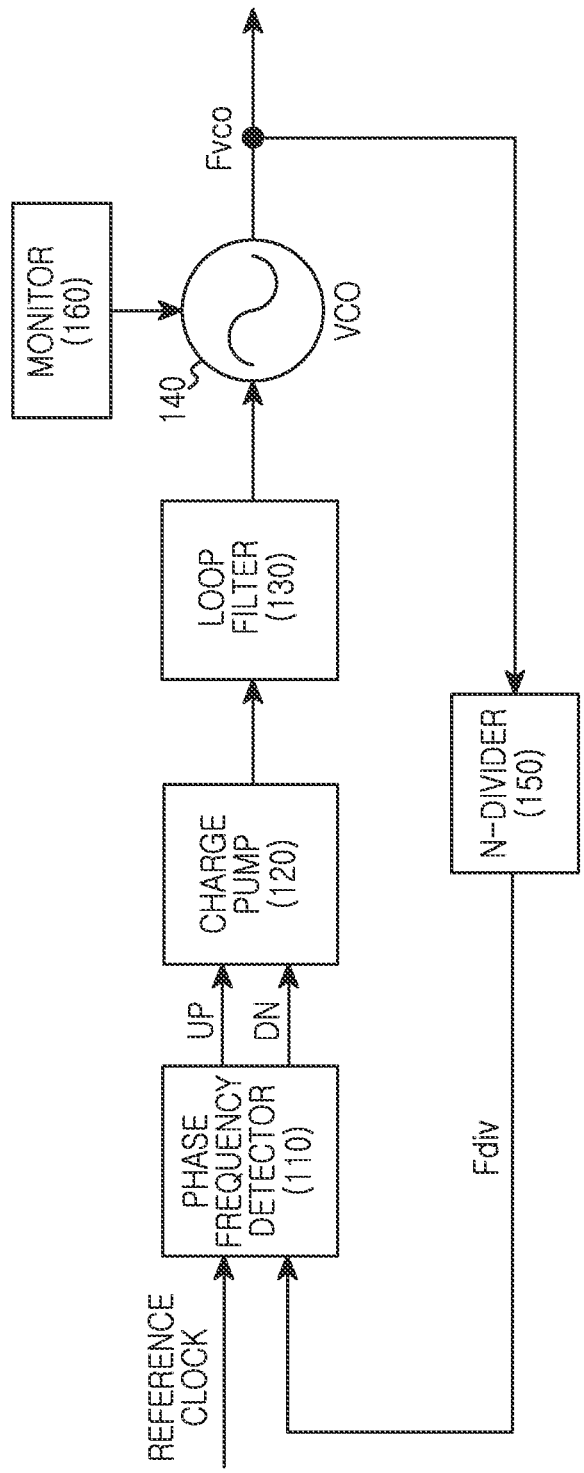
FIG. 1 illustrates an electronic device according to an embodiment of the present disclosure.

FIG. 1 is a block diagram of an electronic device according to an embodiment of the present disclosure.

Referring to FIG. 1, the electronic device includes a phase-frequency detector 110, a charge pump 120, a loop filter 130, a Voltage Controlled Oscillator (VCO) 140, an N-divider 150, and a monitor 160.

The phase-frequency detector 110 receives a reference clock, and a feedback signal Fdiv from the N-divider 150, and determines a frequency difference and a phase difference of the reference clock and the feedback signal. The phase-frequency detector 110 outputs one of an up-signal UP and a down-signal DN based on the reference clock and the Fdiv signal. That is, the phase-frequency detector 110 compares the phase of the reference clock and the received feedback signal, and outputs either the up-signal or the down-signal according to the comparison. In more detail, the phase-frequency detector 110 outputs the up-signal when the phase of the reference clock is faster than the phase of the feedback signal, and outputs the down-signal when the phase of the reference clock is slower than the phase of the feedback signal.

The charge pump 120 supplies or recovers charge of a certain amount of the loop filter 130 based on the signal output from the phase-frequency detector 110. Since the voltage is raised or lowered from a reference voltage according to the difference between the reference clock and the feedback signal, the charge pump 120 performs two branch operations. That is, the charge pump 120 supplies the charge to increase the voltage and recovers the charge to lower the voltage. That is, the charge pump 120 supplies the charge when the up-signal is input, and recovers the charge when the down-signal is input.

The loop filter 130 accumulates or discharges the charges supplied or recovered by the charge pump 120. The charge accumulated in the loop filter 130 varies depending on the charge pump 120. For example, the loop filter 130 may employ a Low Pass Filter (LPF). The loop filter 130 applies a control voltage to the VCO 140. That is, the loop filter 130 varies the control voltage of the VCO 140.

The VCO 140 outputs a signal of a frequency corresponding to the control voltage. That is, the VCO 140 outputs the signal of the frequency corresponding to the voltage fed from the loop filter 130. The VCO 140 controls current supply and output amplitude under control of the monitor 160.

The N-divider 150 divides the output signal of the VCO 140 and then outputs the divided signal to the phase-frequency detector 110. That is, the N-divider 150 changes the frequency of the output signal of the VCO 140 with a frequency adequate for the phase comparison of the phase-frequency detector 110. For example, the N-divider 150 may be configured similarly to a digital counter.

The monitor 160 determines the process variation of the circuit component of the VCO 140, and controls the current supply of the VCO 140 based on the process variation. The monitor 160 outputs a current control signal to the VCO 140. For example, the current control signal may control a current source of the VCO 140 or a regulator. When controlling the current source, a control bitstring may indicate whether to activate transistors for supplying the current. The monitor 160 is described in more detail in FIG. 2.

Figure 2:
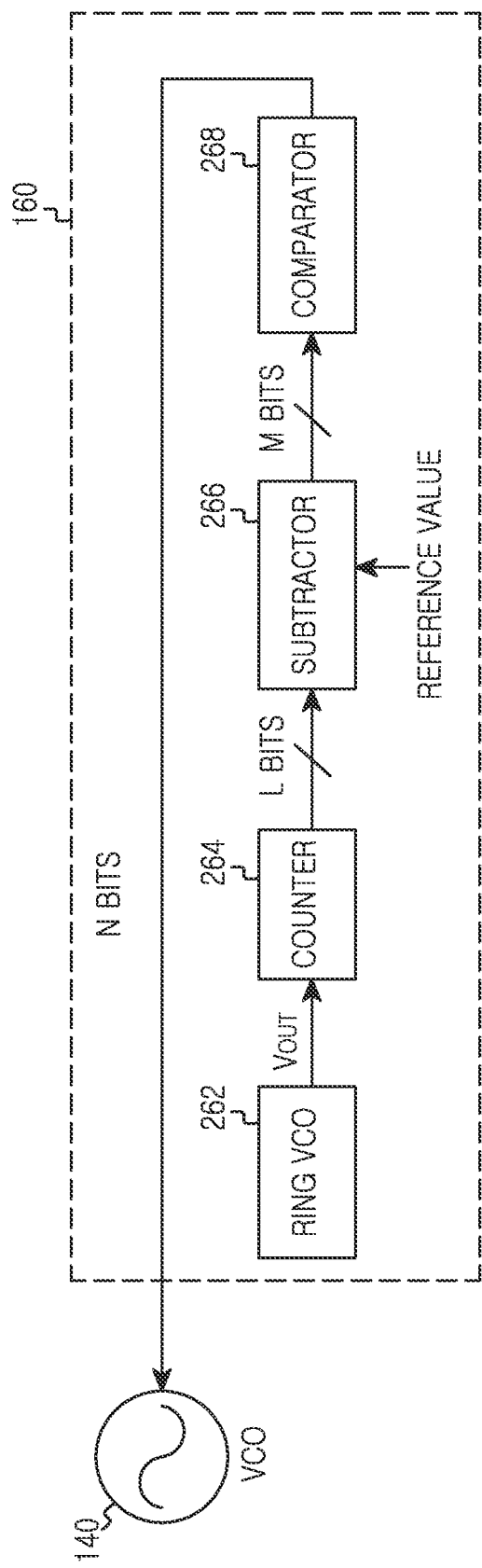
FIG. 2 illustrates a process variation monitoring circuit in an electronic device according to an embodiment of the present disclosure.

FIG. 2 is a block diagram of a process variation monitoring circuit in an electronic device according to an embodiment of the present disclosure. FIG. 2 depicts an example of the monitor 160 of FIG. 1.

Referring to FIG. 2, the monitor 160 includes a ring VCO 262, a counter 264, a subtractor 266, and a comparator 268.

The ring VCO 262 includes transistors of the same process characteristics as the transistors of the VCO 140. The ring VCO 262 generates a pulse signal of a certain frequency, and the frequency may vary according to the process characteristics of the transistors of the ring VCO 262. For example, the ring VCO 262 may be configured by connecting an odd number of inverters in serial using the transistor and inputting an inverter output of the last stage to the inverter of the initial stage.

The counter 264 counts the number of pulses during a certain time period in the pulse signal output from the ring VCO 262. The counter 264, which is a digital component, outputs digital data, that is, a bitstring indicating the counting result. For example, the counter 264 may count the number of the pulses of the output signal of the ring VCO 262 during one pulse width of the reference clock.

The subtractor 266 subtracts a predefined reference value from the counting value of the counter 264. The subtractor 266, which is a digital device, outputs the subtraction result as the bitstring. That is, the subtractor 266 outputs information indicating how much the counting value is greater than the reference value.

The comparator 268 generates a current control signal for controlling the current supply of the VCO 140 according to the subtraction result of the subtractor 260. The current control signal value is determined to correspond to the range of the subtraction result. That is, the comparator 268 determines the range of the subtraction result output from the subtractor 260, from among ranges corresponding to the first process characteristic, the second process characteristic, and the third process characteristic, and outputs the current control signal based on the determined range. For example, the first process characteristic has the relatively greater current supply of the same circuit component. In this case, the comparator 268 outputs the current control signal controlling to deactivate more circuit components than the other process characteristics.

More specifically, in the first process characteristic, the current of the VCO 140 relatively increases. Hence, the current control signal value is determined to reduce the number of the activated transistors in the current source of the VCO 140, compared to the second process characteristic. By contrast, the output frequency of the ring VCO 262 is relatively low in the third process characteristic and accordingly the current control signal value is determined to increase the number of the activated transistors in the current source of the VCO 140.

Figure 3:
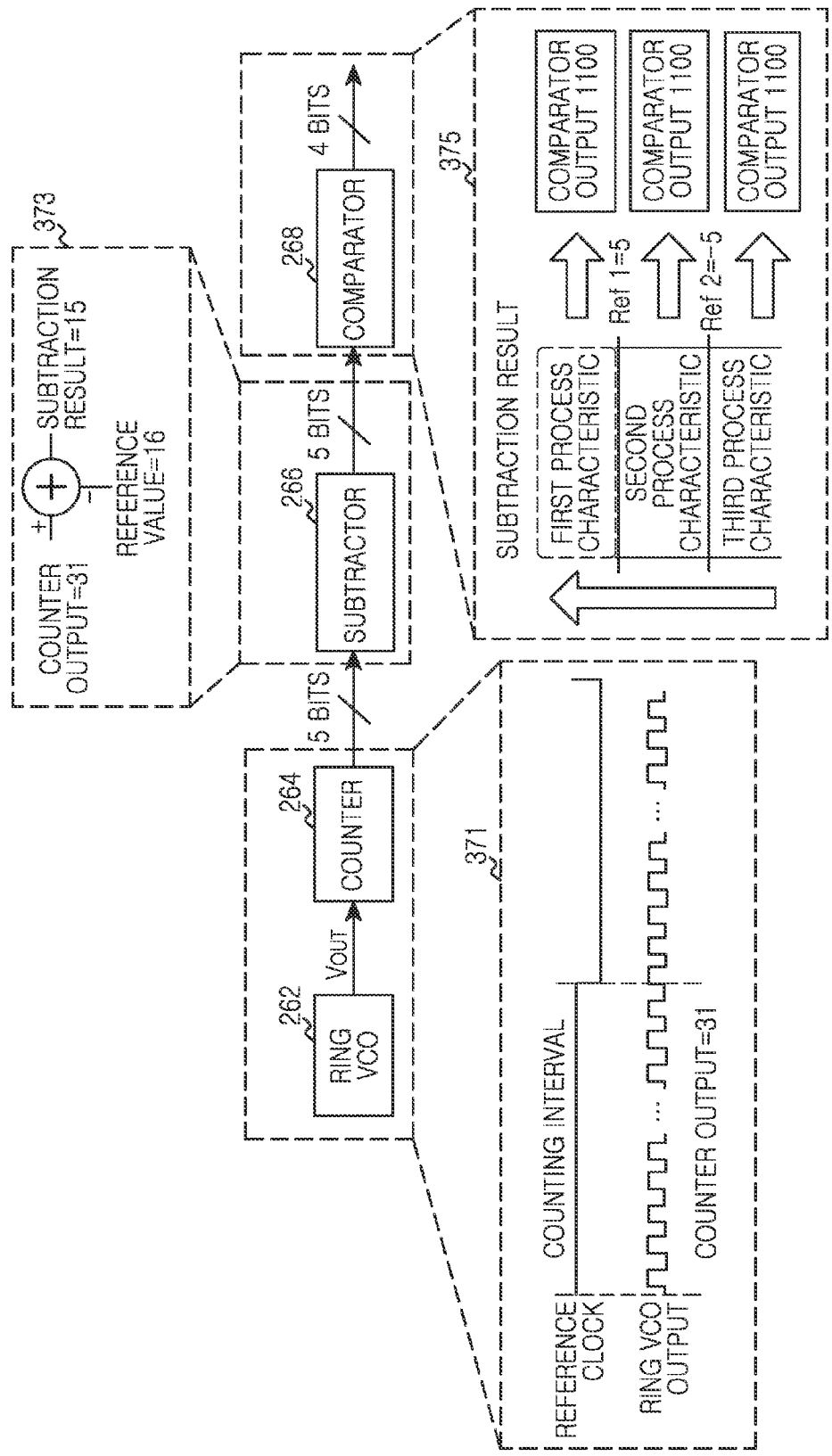
FIG. 3 illustrates operations of a process variation monitoring circuit in an electronic device according to an embodiment of the present disclosure.

The process variation monitoring and compensation in the structure of FIG. 2 is explained in FIG. 3.

FIG. 3 depicts operations of the process variation monitoring circuit in an electronic device according to an embodiment of the present disclosure. Referring FIG. 3, the operations are conducted in each block of the monitor 160 of FIG. 2.

Referring to FIG. 3, the ring VCO 262 and the counter 264 performs counting at operation 371. In FIG. 3, one pulse width of the reference clock is set to a counting interval, and the ring VCO 262 outputs 31 pulses during one counting interval. The counter 264 counts the 31 output pulses and outputs the 5-bit counting result. Hence, the counting output is binary with 31. While the counting interval is defined based on the reference clock in FIG. 3, the monitor 160 may further include a separate clock generator for dividing the counting interval.

The subtractor 266 performs subtraction at operation 373. In FIG. 3, the counting output is 31 and the reference value is 16. As a result, the subtraction result is 15. The reference value may differ in various embodiments. For example, the reference value may be defined based on the process and the frequency range of the VCO 140. Alternatively, the subtractor 266 may receive the reference value from the outside. The reference value may be predicted and defined through a simulation, or based on the component of the second process characteristic, that is, of the typically operation.

The comparator 268 performs control signal output at operation 375. In FIG. 3, a boundary value between the first process characteristic and the second process characteristic is set to 5 and a boundary value between the second process characteristic and the third process characteristic is set to −5. In other words, the first process characteristic is determined when the subtraction result exceeds 5, the second process characteristic is determined when the subtraction result lies between −5 and 5, and the third process characteristic is determined when the subtraction result falls below −5. The boundary value may differ in various embodiments. For example, the boundary value may be defined based on the process and the frequency range of the VCO 140. Alternatively, the comparator 268 may receive the boundary from the outside. The boundary value may be predicted and defined through a simulation, or based on the component of the second process characteristic, that is, of the typically operation. The current control signal value is set to '1100' for the first process characteristic, '1110' for the second process characteristic, and '1111' for the third process characteristic. Since the subtraction result is 15 in FIG. 3, the first process characteristic is determined and the current control signal value is '1100'.

The current control signal may control the current source or the regulator of the VCO 140. For example, when the current control signal controls the current source, it may indicate whether to activate the transistors supplying the current in the current source. In this case, the current control signal of FIG. 3 may indicate whether to activate four transistors. For example, '1100' may activate two of the four transistors, '1110' may activate three of the four transistors, and '1111' may activate all of the four transistors. When the current control signal controls the regulator, it may indicate the voltage level applied to the VCO internal circuit in the regulator.

Figure 4:
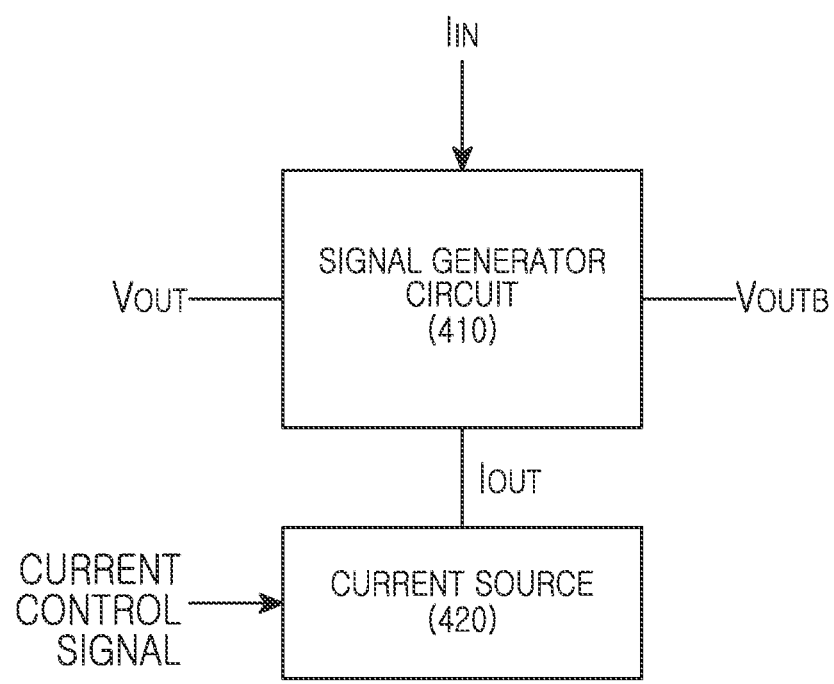
FIG. 4 illustrates a circuit of a Voltage Controlled Oscillator (VCO) according to an embodiment of the present disclosure.

FIG. 4 depicts a circuit of a VCO according to an embodiment of the present disclosure.

Referring to FIG. 4, the VCO includes a signal generator circuit 410 and a current source 420. The signal generator circuit 410 generates the frequency signal, and the frequency signal is output to a port $V_{OUT}$ and a port $V_{OUTB}$. The signal generator circuit 410 consumes the current for the operation, and the current is input to a port $I_{IN}$ and flows through a port $I_{OUT}$. The signal generator circuit 410 may be configured as shown in FIG. 5.

Figure 5:
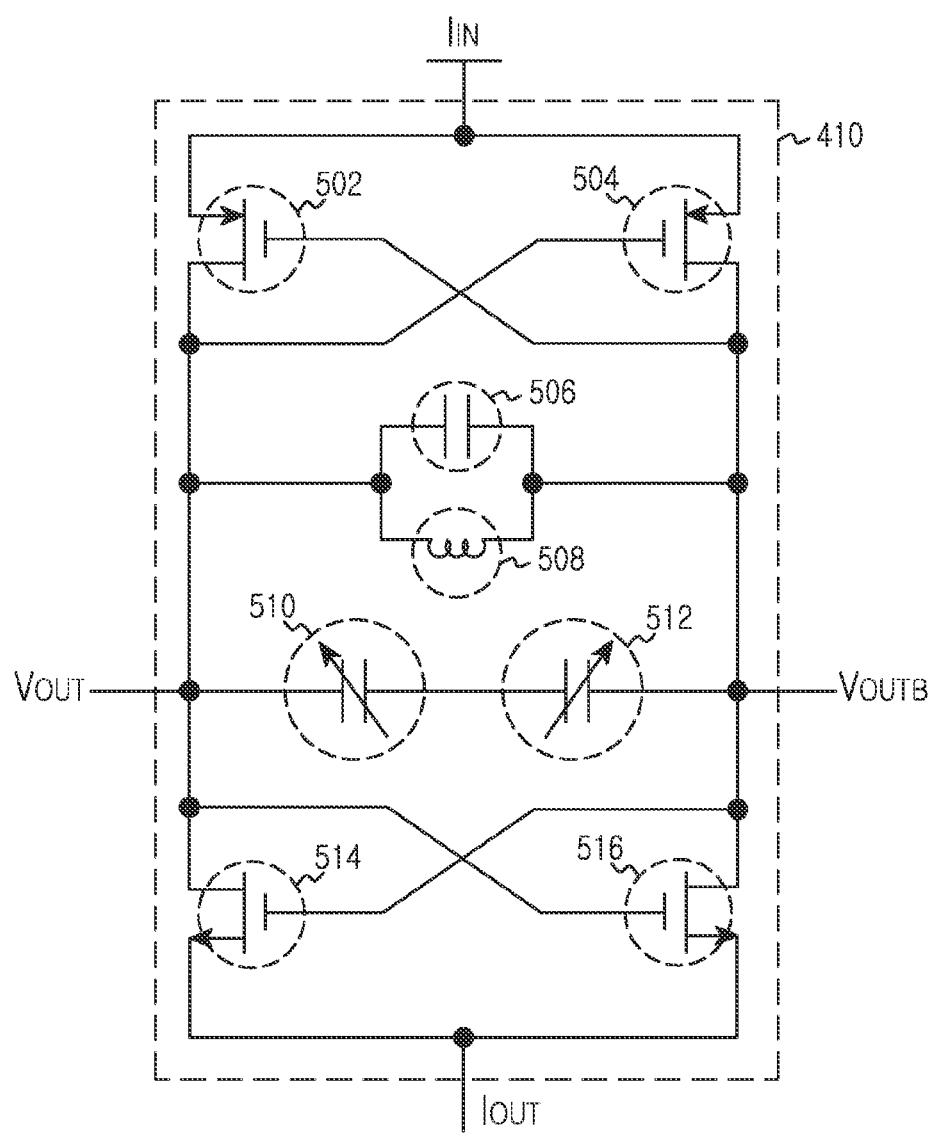
FIG. 5 illustrates a circuit of a signal generating circuit of a VCO according to an embodiment of the present disclosure.

FIG. 5 depicts a circuit of a signal generating circuit of a VCO according to an embodiment of the present disclosure.

Referring to FIG. 5, the signal generating circuit 410 includes a first P-type Metal Oxide Semiconductor (PMOS) transistor 502, a second PMOS transistor 504, a capacitor 506, an inductor 508, variable capacitors 510 and 512, a first N-type MOS (NMOS) transistor 514, and a second NMOS transistor 516. Sources of the first PMOS transistor 502 and the second PMOS transistor 504 are connected to the port $I_{IN}$, a gate of the first PMOS transistor 502 is connected to a drain of the second PMOS transistor 504, and a gate of the second PMOS transistor 504 is connected to a drain of the first PMOS transistor 502. Ends of the capacitor 506 and the inductor 508 are connected to the port $V_{OUT}$ and the port $V_{OUTB}$, the variable capacitors 510 and 512 are connected to each other with one end, and their other ends are respectively connected to the port $V_{OUT}$ and the port $V_{OUTB}$ respectively. Sources of the first NMOS transistor 514 and the second NMOS transistor 516 are connected to the port $I_{IN}$, a gate of the first NMOS transistor 514 is connected to a drain of the second NMOS transistor 516, and a gate of the second NMOS transistor 516 is connected to drain of the first PMOS transistor 514.

The current source 420 is connected to the port $I_{OUT}$ as shown in FIG. 4, and supplies the current for the signal generator circuit 410. The current source 420 connected to the port $I_{OUT}$, which is the current source using the NMOS transistor, is smaller than the PMOS transistor in size, whereas it may cause greater noise. The current source 420 controls the current supply according to the current control signal. For example, the current source 420 includes the plurality of the transistors for supplying the current, activates only the transistors corresponding to the bits set to a positive value, e.g., 1, of the current control signal, and thus controls the current supply. For example, the current source 420 may be configured as shown in FIG. 6.

Figure 6:
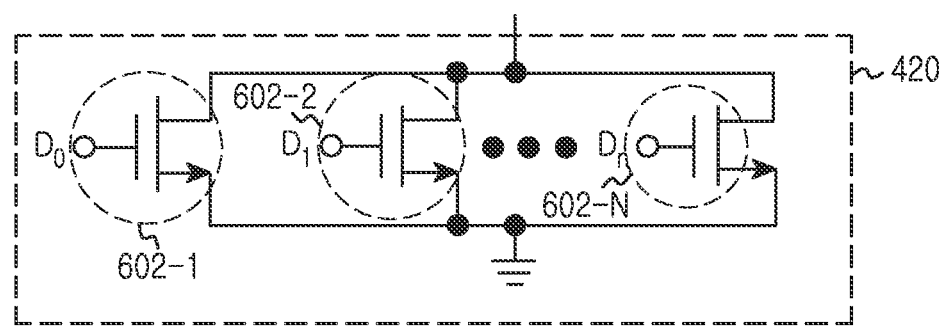
FIG. 6 illustrates a circuit of a current source of a VCO according to an embodiment of the present disclosure.

FIG. 6 depicts a circuit of a current source of a VCO according to an embodiment of the present disclosure.

Referring to FIG. 6, the current source 420 includes N NMOS transistors 602-1 through 602-N. The N NMOS transistors 602-1 through 602-N supply the current according to the bits of the current control signal. The drains of the N NMOS transistors 602-1 through 602-N are connected to the port $I_{OUT}$, and the sources are grounded. The bits of the current control signal are applied to gates of the N NMOS transistors 602-1 through 602-N, respectively. At this time, only the NMOS transistor receiving the positive value, e.g., 1, supplies the current. That is, all or part of the N NMOS transistors 602-1 through 602-N connected in parallel supplies the current as indicated by the current control signal, and thus the total current supply of the current source 420 may be regulated.

Figure 7:
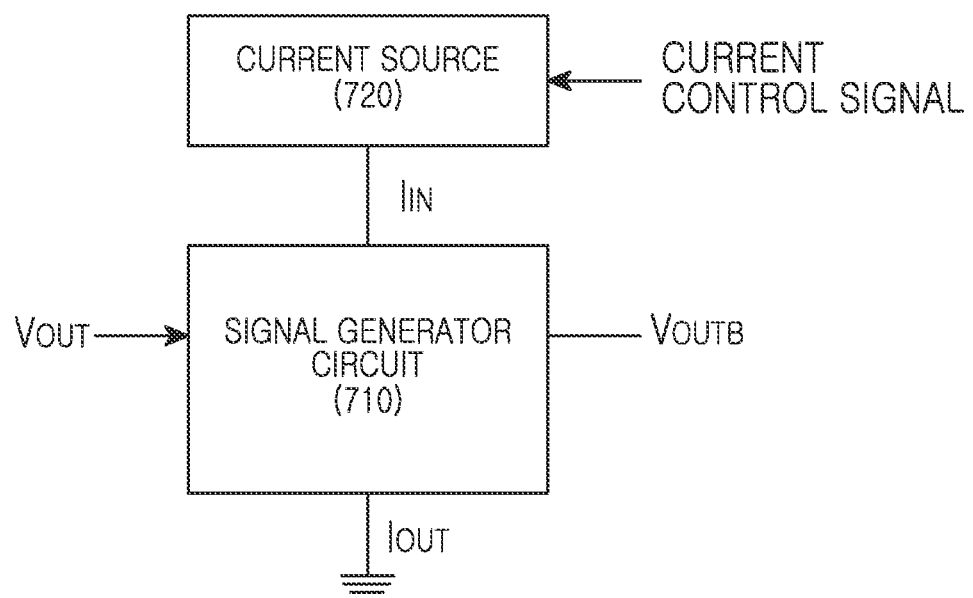
FIG. 7 illustrates another circuit of a VCO according to an embodiment of the present disclosure.

FIG. 7 depicts another circuit of a VCO according to an embodiment of the present disclosure.

Referring to FIG. 7, the VCO includes a signal generator circuit 710 and a current source 720. The signal generator circuit 710 generates the frequency signal, and the frequency signal is output to the port $V_{OUT}$ and the port $V_{OUTB}$. The signal generator circuit 710 consumes the current for the operation, and the current is input to the port $I_{IN}$ and flows through the port $I_{OUT}$. The signal generator circuit 710 may be configured as shown in FIG. 5.

The current source 720 is connected to the port $I_{IN}$ and supplies the current for operating the signal generator circuit 710. The current source 720 connected to the port $I_{OUT}$, which is the current source using the PMOS transistor, is larger than the NMOS transistor in size but may cause less noise. The current source 720 controls the current supply according to the current control signal. For example, the current source 420 includes the plurality of the transistors for supplying the current, activates only the transistors corresponding to the bits set to the positive value, e.g., 1, of the current control signal, and thus controls the current supply. For example, the current source 720 may be configured as shown in FIG. 8.

Figure 8:
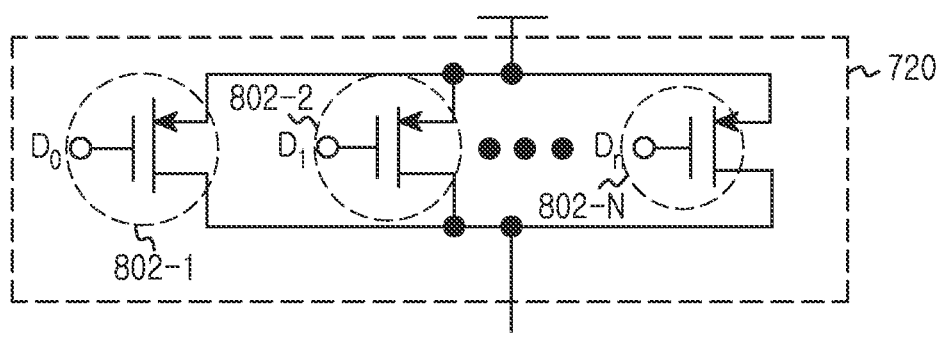
FIG. 8 illustrates another circuit of a current source of a VCO according to an embodiment of the present disclosure.

FIG. 8 depicts another circuit of a current source of a VCO according to an embodiment of the present disclosure.

Referring to FIG. 8, the current source 720 includes N PMOS transistors 802-1 through 802-N. The N PMOS transistors 802-1 through 802-N supply the current according to the bits of the current control signal. Drains of the N PMOS transistors 802-1 through 802-N are connected to the port $I_{IN}$. The bits of the current control signal are applied to gates of the N PMOS transistors 802-1 through 802-N, respectively. At this time, only the PMOS transistor receiving the positive value, e.g., 1, supplies the current. That is, all or part of the N PMOS transistors 802-1 through 802-N connected in parallel, supplies the current as indicated by the current control signal, and thus the total current supply of the current source 720 may be regulated.

Figure 9:
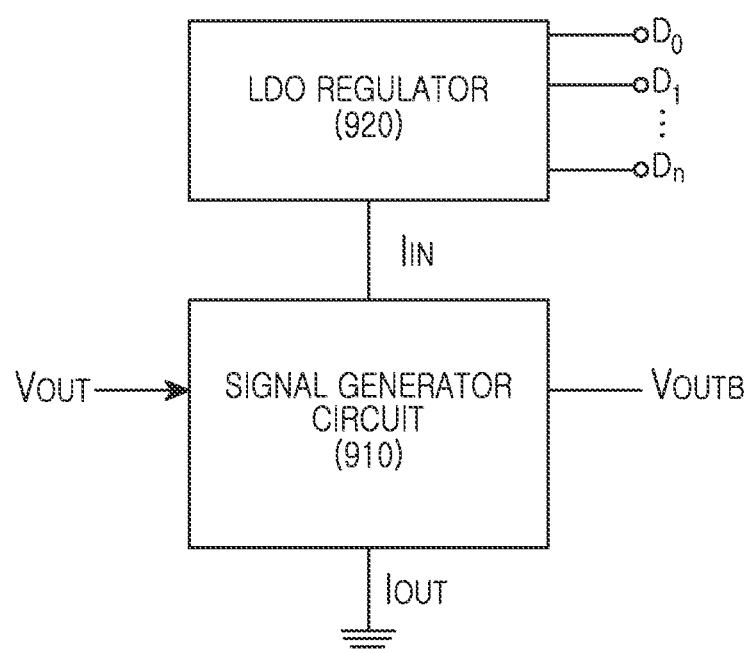
FIG. 9 illustrates yet another circuit of a VCO according to an embodiment of the present disclosure.

FIG. 9 depicts yet another circuit of a VCO according to an embodiment of the present disclosure.

Referring to FIG. 9, the VCO includes a signal generator circuit 910 and a Low-Dropout (LDO) regulator 920. The signal generator circuit 910 generates the frequency signal, and the frequency signal is output to the port $V_{OUT}$ and the port $V_{OUTB}$. The signal generator circuit 910 consumes the current for the operation, and the current is input to the port $I_{IN}$ and flows through the port $I_{OUT}$. The signal generator circuit 910 may be configured as shown in FIG. 5.

The LDO regulator 920 is connected to the port $I_{IN}$ and supplies the voltage. The LDO regulator 920 controls the voltage supply according to the current control signal. For example, the LDO regulator 920 determines the supply voltage value according to the number of the bits set to the positive value, e.g., 1, of the current control signal. For example, the more bits are set to the positive value, the higher supply voltage value is output.

As such, the circuit for compensating for the VCO is explained. The monitoring circuit of the present disclosure is the digital circuit with the digital output, and thus is applicable to any circuit including the component having the process variation. Accordingly, the present disclosure is not limited to the VCO and is equally applicable to any circuit including the component with the process variation such as transistor.

Figure 10:
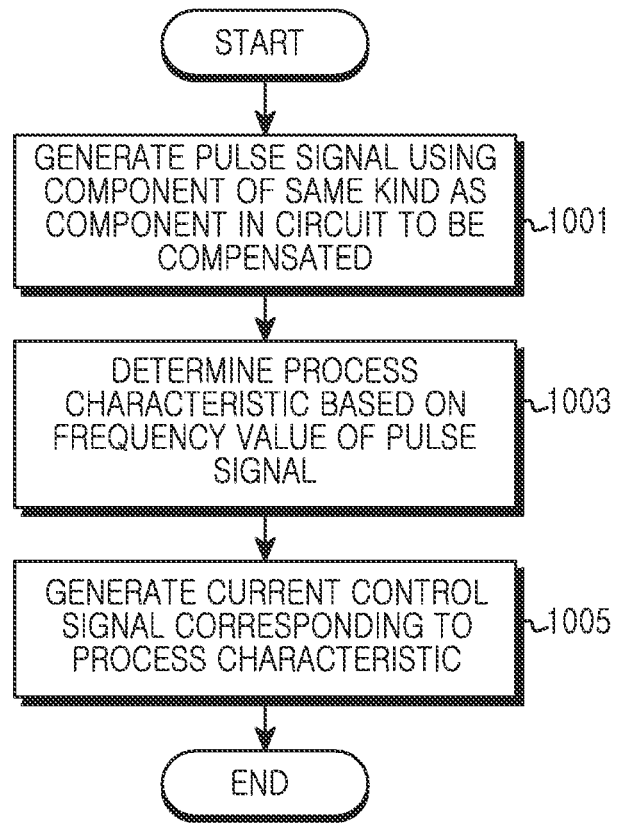
FIG. 10 illustrates operations of an electronic device according to an embodiment of the present disclosure.

FIG. 10 depicts operations of the electronic device according to an embodiment of the present disclosure.

Referring to FIG. 10, the electronic device generates a pulse signal using a component of a same kind as a component in the circuit to be compensated in operation 1001. For example, the component may be the transistor. The pulse signal may be generated by a ring VCO, including the inverters, using the transistor. The frequency of the output signal of the ring VCO varies according to the process characteristic of the transistor.

In operation 1003, the electronic device determines the process characteristic of the device based on the frequency value of the pulse signal. That is, the component used to generate the pulse signal and the component in the circuit to be compensated have the same, and/or substantially similar, characteristics. For example, the electronic device determines the process characteristic based on the ranges of the frequency value with respect to the plurality of the predefined process characteristics. More specifically, the electronic device may compare the number of the pulses of the pulse signal of the certain time period with the boundary values of the ranges. To reduce the number of the information bits for the range determination, the electronic device may compare the value obtained by subtracting the reference value from the number of the pulses, with the boundary values.

In operation 1005, the electronic device generates the current control signal corresponding to the process characteristic, and applies the current control signal to the circuit to compensate. The current control signal regulates the current supplied to the circuit to compensate. For example, the current control signal may indicate whether to activate the components supplying the current in the current source, or indicate the supply voltage of the regulator. That is, the current control signal may be a set of indicator bits relating to the activation of the components for supplying the current in the current source.

Figure 11:
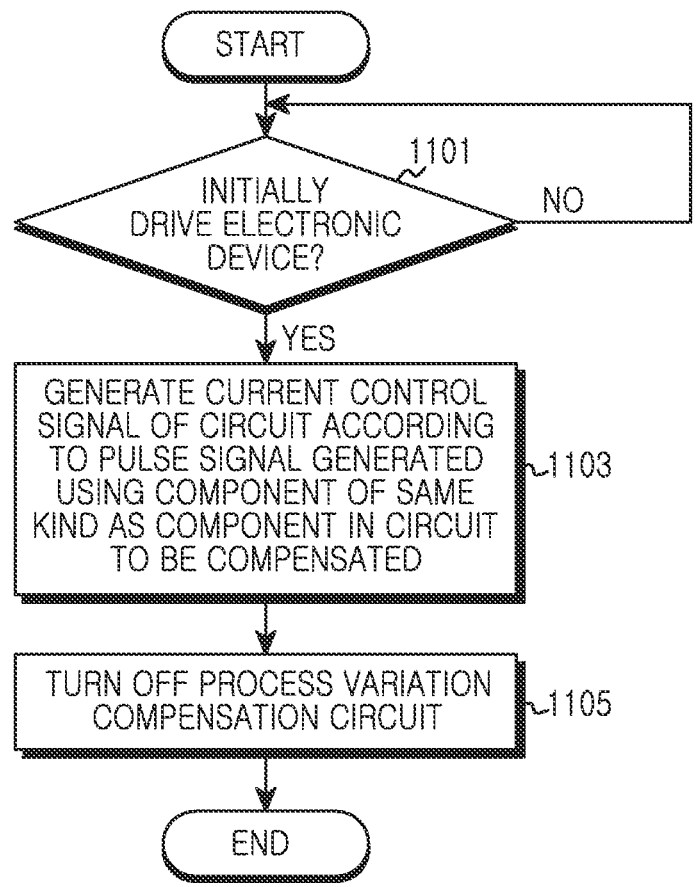
FIG. 11 illustrates operations of an electronic device according to another embodiment of the present disclosure.

FIG. 11 illustrates operations of an electronic device according to another embodiment of the present disclosure.

Referring to FIG. 11, the electronic device determines whether it is initially driven in operation 1101. For example, the electronic device determines whether it is turned on.

At the initial driving, the electronic device generates the current control signal of the circuit according to the pulse signal generated using a component of the same kind as a component in the circuit to be compensated in operation 1103. For example, the pulse signal may be generated by the ring VCO, including the inverters, using the transistor. More specifically, the electronic device may determine the process characteristic based on the ranges of the frequency value with respect to the plurality of the predefined process characteristics, and may generate the current control signal corresponding to the process characteristic. The current control signal regulates the compensation current supplied to the circuit.

In operation 1105, the electronic device switches and/or turns off the process variation compensation circuit. That is, after determining the current control signal value, that is, after compensating for the process variation, the electronic device switches off the process variation compensation circuit. That is, the electronic device turns off at least one component in the process variation compensation circuit.

As set forth above, the process variation compensation method is carried out at the initial driving of the electronic device. In more detail, the process variation compensation may be conducted in a certain time after the initial power-on of the electronic device, because it takes at least some time to normally operate the circuit in the electronic device. For example, the process variation compensation may be fulfilled after the circuit needing the process variation compensation, and the circuit for the process variation compensation, are normalized. That is, the initial driving includes the normal operation.

The electronic device performs the calibration at the initial driving, and the process variation monitoring and compensation circuit does not operate all the time. Accordingly, additional current is not consumed for the process variation compensation except for the operation of the circuit to compensate, and it is less likely that the phase noise of the circuit to compensate is degraded.

The process variation may be obtained with the digital output. Hence, the bias current for compensating for the process variation may be set without an additional circuit, by designing bias circuits of circuits sensitive to the process variation like a current source array.

The current may be optimized by regulating the supply current of the circuit according to the process variation in the electronic device. Further, since the process variation is monitored and controlled using the simple digital circuit, the circuit may be easily designed even under the change of the circuit process. In addition, the digital output may be widely applied to various circuits.

Embodiments of the present invention according to the claims and description in the specification can be realized in the form of hardware, software or a combination of hardware and software.

Such software may be stored in a computer readable storage medium. The computer readable storage medium stores one or more programs (software modules), the one or more programs comprising instructions, which when executed by one or more processors in an electronic device, cause the electronic device to perform methods of the present invention.

Such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disc (CD), Digital Video Disc (DVD), magnetic disk or magnetic tape or the like. It will be appreciated that the storage devices and storage media are embodiments of machine-readable storage that are suitable for storing a program or programs comprising instructions that, when executed, implement embodiments of the present invention. Embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a first circuit; and
   a second circuit,
   wherein the second circuit is configured to:
      generate a pulse signal by using a second element, corresponding to a first element of the first circuit, of the second circuit, and
      transmit, to the first circuit, a signal for determining a current being provided to the first circuit, generated based on a frequency of the pulse signal, and
   wherein the first circuit is configured to generate an output signal based on the determined current.

2. The electronic device of claim 1, wherein the second element comprises a transistor.

3. The electronic device of claim 1, wherein the pulse signal indicates a performance of the first element.

4. The electronic device of claim 1, wherein the frequency of the pulse signal varies according to a performance of the second element.

5. The electronic device of claim 1, wherein the signal indicates whether to activate each of the first element and the second element in the first circuit for determining the current being provided to the first circuit.

6. The electronic device of claim 1, wherein the signal indicates a voltage provided to a regulator of the first circuit.

7. The electronic device of claim 1, wherein the first element and the second element have a same performance according to a manufacturing process.

8. The electronic device of claim 1, wherein the second circuit comprises:
   a digital circuit configured to:
      determine a value associated with a performance of the second element based on the frequency, and
      transmit, to the first circuit, the signal generated according to the value.

9. The electronic device of claim 8, wherein the digital circuit is configured to:
   count a number of pulses of the pulse signal corresponding to a certain period, and
   determine the value based on the number of pluses and a reference value, wherein the reference value is determined based on at least one of a frequency range of the first circuit and a process of manufacturing the first element.

10. The electronic device of claim 1, wherein the first element and the second element are equivalent in a process.

11. A method for operating an electronic device, the method comprising:
    generating a pulse signal by using a second element, corresponding to a first element of the first circuit, of a second circuit;
    transmitting, from the second circuit to the first circuit, a signal for determining a current being provided to the first circuit, generated based on a frequency of the pulse signal; and
    generating an output signal based on the determined current.

12. The method of claim 11, wherein the second element comprises a transistor.

13. The method of claim 11, wherein the first circuit comprises a Voltage Controlled Oscillator (VCO).

14. The method of claim 11, wherein the frequency varies according to a performance of the second element.

15. The method of claim 11, wherein the signal indicates whether to activate each of the first element and the second element in the first circuit for determining the current being provided to the circuit.

16. The method of claim 11, wherein the signal indicates a voltage provided to a regulator for the first circuit.

17. The method of claim 11, wherein the first element and the second element have a same performance according to a manufacturing process.

18. The method of claim 11, wherein the transmitting of the signal comprises:
    determining a value associated with a performance of the second element based on the frequency in a digital circuit included in the second circuit; and
    transmitting, to the first circuit, the signal generated according to the value in the digital circuit.

19. The method of claim 18, wherein the determining of the value comprises:
    counting a number of pulses of the pulse signal corresponding to a certain period; and
    determining the first value based on the number of pluses and a reference value,
    wherein the reference value is determined based on at least one of a frequency range of the first circuit and a process of manufacturing the first element.

20. The method of claim 11, wherein the first element and the second element are equivalent in a process.

* * * * *